United States Patent
Cheng et al.

(10) Patent No.: US 10,820,411 B1
(45) Date of Patent: Oct. 27, 2020

(54) MANUFACTURING METHOD FOR CIRCUIT BOARD AND CIRCUIT BOARD THEREOF

(71) Applicant: Unimicron Technology Corporation, Taoyuan (TW)

(72) Inventors: Shih-Lian Cheng, Taoyuan (TW); Zhe-Yong Lin, Taoyuan (TW); Li-Jie Liu, Taoyuan (TW); Ching Sheng Chen, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 16/879,951

(22) Filed: May 21, 2020

(30) Foreign Application Priority Data

Apr. 6, 2020 (TW) .............................. 109111482 A

(51) Int. Cl.
*H05K 1/02* (2006.01)
*H05K 3/02* (2006.01)
*H05K 1/09* (2006.01)
*H05K 3/06* (2006.01)

(52) U.S. Cl.
CPC .............. *H05K 1/024* (2013.01); *H05K 1/09* (2013.01); *H05K 3/027* (2013.01); *H05K 3/064* (2013.01); *H05K 2203/0723* (2013.01)

(58) Field of Classification Search
CPC .......... H05K 1/024; H05K 3/027; H05K 1/09; H05K 3/064; H05K 2203/0723
USPC ........................................................ 174/258
See application file for complete search history.

(56) References Cited

U.S. PATENT DOCUMENTS

| 6,617,509 | B1 * | 9/2003 | Bergstedt | ............. H05K 1/0231 |
| | | | | 174/261 |
| 9,711,445 | B2 | 7/2017 | Yu et al. | |
| 9,824,964 | B2 | 11/2017 | Yu et al. | |
| 10,079,158 | B2 | 9/2018 | Kong et al. | |
| 2016/0198568 | A1 * | 7/2016 | Park | ..................... H05K 3/4682 |
| | | | | 361/768 |

FOREIGN PATENT DOCUMENTS

TW I573506 B 3/2017

* cited by examiner

*Primary Examiner* — Sherman Ng
(74) *Attorney, Agent, or Firm* — Karin L. Williams; Mayer & Williams PC

(57) ABSTRACT

A manufacturing method for a circuit board and a circuit board are provided. The method includes steps: providing a substrate having a first metal layer; forming a patterned first opening on the first metal layer to expose the substrate; forming a patterned first dielectric layer on the substrate, the first dielectric layer is made of a photosensitive dielectric material and covers the first opening; photosensitizing the first dielectric layer to cure the first dielectric layer; forming a patterned second metal layer on the first metal layer; forming a patterned third metal layer on the second metal layer, and the third metal layer being adjacent to the first dielectric layer; removing a portion of the first metal layer not covered by the second metal layer; and forming a second dielectric layer on the substrate. A thickness of the third metal layer is greater than a thickness of the second metal layer.

10 Claims, 10 Drawing Sheets

MANUFACTURING METHOD FOR CIRCUIT BOARD AND CIRCUIT BOARD THEREOF

FIELD OF THE INVENTION

The present invention relates to the field of a manufacturing method for a circuit board and a circuit board manufactured by the method thereof.

BACKGROUND OF THE INVENTION

Currently, 4G LTE has a transmission rate of about 1 Gbps, while 5G networks (frequency 20 to 150 GHz) will use wider channels to communicate with wireless devices, with a bandwidth of up to 800 MHz and a transmission rate of about 6 to 50 Gbps. During such high-speed and high-frequency transmission, there will be high energy loss and noise interference. Therefore, the circuit board currently used in 5G technology is mainly designed to improve impedance matching to reduce loss and noise. To this end, a 3D trench technology has been proposed, which manufactures different copper layers having different thicknesses on the same current wire. This technology is exactly such a technology disclosed by Intel Corporation in its U.S. Ser. No. 10/079,158.

As shown in FIG. 1A, U.S. Ser. No. 10/079,158 discloses a circuit board 100, the circuit board 100 including a pair of signal wires 110 forming a differential signal pair, each of the signal wires 110 including a first portion 112 and a second portion 114, wherein the second portion 114 extends from the first portion 112, and a thickness of the second portion 114 is greater than a thickness of the first portion 112. However, when the signal wire 110 is fabricated, a problem as shown in FIG. 1B may occur. It can be seen from FIG. 1B that the second portion 114 of the signal wire 110 is not at a predetermined position, but is misaligned (as circled by the dotted line in FIG. 1B). This is caused by the fact that the first portion 112 and the second portion 114 of the signal wire 110 have to undergo two photolithography processes, but the alignment of the exposure between the two photolithography processes will be different, so the second portion 114 in the signal wire 110 will not be at a predetermined position. In this way, the efficiency of the signal wire 110 in reducing loss and noise will be deteriorated, and unnecessary parasitic capacitance and inductance will be generated.

Therefore, how to prevent the first portion 112 and the second portion 114 of the signal wire 110 from being misaligned as much as possible is worth considering by those skilled in the art.

SUMMARY OF THE INVENTION

An objective of the present disclosure is to provide a manufacturing method for a circuit board, so as to solve the problem of misalignment between the first portion and the second portion of the signal wire. The manufacturing method for the circuit board includes the following steps:

(a) providing a substrate, having a first metal layer on the substrate;

(b) forming a patterned first opening on the first metal layer, the first opening exposing the substrate;

(c) forming a patterned first dielectric layer on the substrate, the first dielectric layer mainly made of a photosensitive dielectric material, and the first dielectric layer covering the first opening;

(d) photosensitizing the first dielectric layer to cure the first dielectric layer;

(e) forming a patterned second metal layer on the first metal layer;

(f) forming a patterned third metal layer on a portion of the second metal layer, and the third metal layer being adjacent to the first dielectric layer;

(g) removing a portion of the first metal layer that is not covered by the second metal layer; and (h) forming a second dielectric layer on the substrate, the second dielectric layer at least covering the first dielectric layer, the second metal layer and the third metal layer;

wherein a thickness of the third metal layer is larger than a thickness of the second metal layer. In some embodiment, the step (e) further includes steps of:

(e1) forming a patterned first photoresist layer on the first metal layer; and (e2) forming the patterned second metal layer on a region of the first metal layer that is not covered by the first photoresist layer.

Further, in the step (e2), the first metal layer is used as a seed layer, and the second metal layer is formed by electroplating.

In some embodiment, the step (f) further includes steps of:

(f1) forming a second photoresist layer on the substrate;

(f2) forming a patterned second opening on the second photoresist layer, the second opening exposing the first dielectric layer and a portion of the second metal layer;

(f3) forming the third metal layer in the second opening; and (f4) removing the second photoresist layer and the first photoresist layer.

Further, in the step (f3), the third metal layer is formed by electroplating.

Further, in the step (h), the second dielectric layer is formed by laminating.

Further, the first metal layer, the second metal layer, and the third metal layer are mainly composed of copper.

Further, the first dielectric layer and the second dielectric layer have different dielectric constants and dissipation factors.

Further, a width of the third metal layer is smaller than a width of the second metal layer.

Another objective of the present disclosure is to provide a circuit board, which includes a substrate, a plurality of patterned first circuits, at least one pair of second circuits, a first dielectric layer, and a second dielectric layer. The plurality of patterned first circuits is disposed on the substrate. The pair of second circuits are disposed on the at least one pair of first circuits. The first dielectric layer is disposed on the substrate, and the first dielectric layer separates the pair of the second circuits and the pair of first circuits disposed on the pair of second circuits. The second dielectric layer is disposed on the substrate, and the second dielectric layer at least covers the first dielectric layer, the first circuits and the pair of second circuits. Thicknesses of the second circuits are greater than thicknesses of the first circuits.

In some embodiment, the first dielectric layer and the second dielectric layer have different dielectric constants and dissipation factors.

In some embodiment, widths of the second circuits are smaller than widths of the first circuits.

In summary, in manufacturing method for a circuit board disclosed by the present disclosure, when the third metal layer is formed, there is no misalignment between the third metal layer and the second metal layer due to the existence of the first dielectric layer and the exposed second metal layer being adjacent to the first dielectric layer. In addition, the first dielectric layer and the second dielectric layer have different dielectric constants and dissipation factors, so there can be more degrees of freedom in the design of the circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE PREFERRED EMBODIMENTS

To enable the above objects, features and advantages of the present disclosure to be more apparent and easily understood, the specific embodiments of the present disclosure will be further elaborated hereafter in connection with the drawings.

Figure 2:
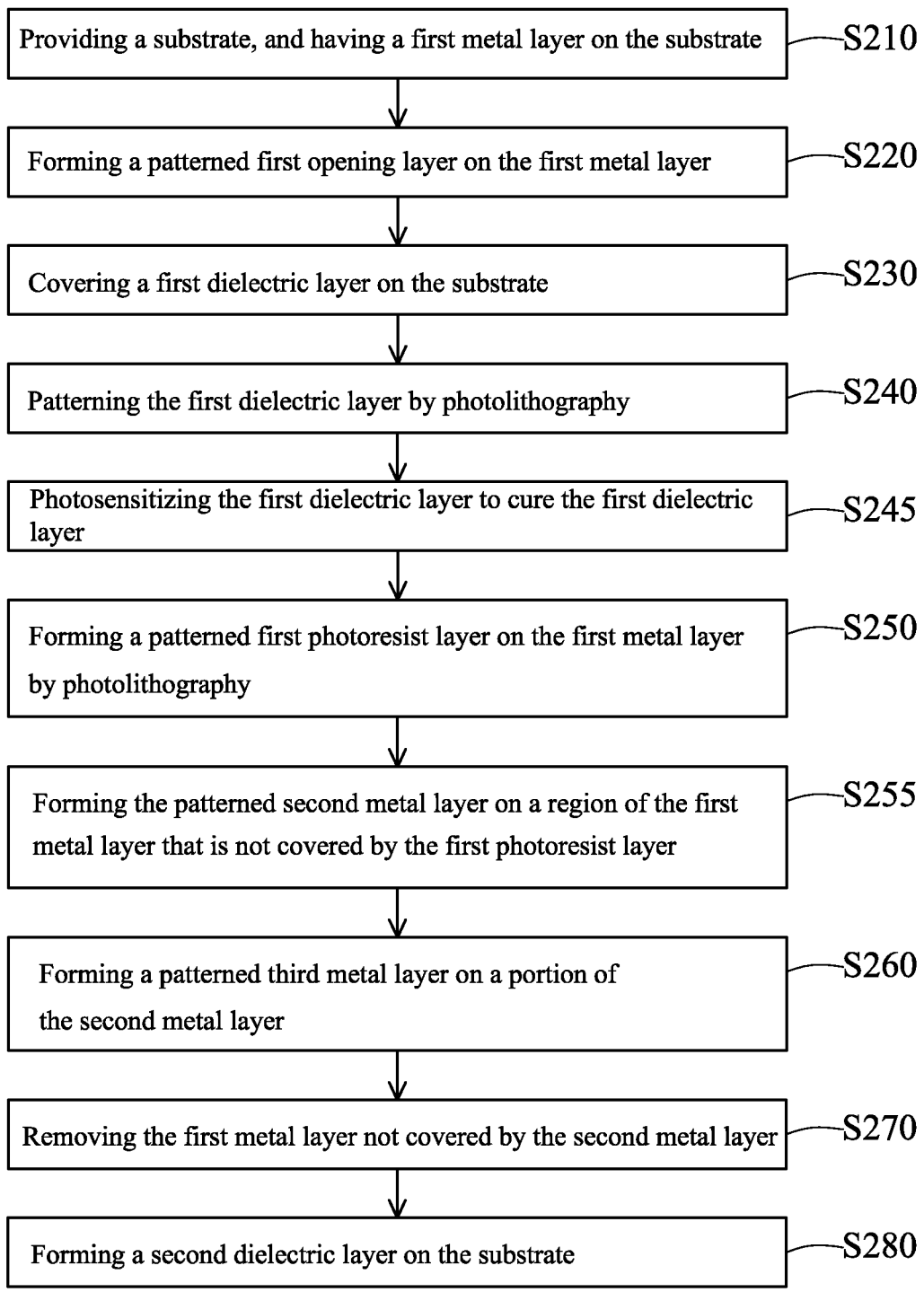
FIG. 2 is flowchart illustrating a manufacturing method for a circuit board according to an embodiment of the present disclosure.

FIG. 2 is a flow chart of an embodiment of the manufacturing method for a circuit board of the present disclosure; FIGS. 3A to 3J illustrate an embodiment of the manufacturing method for a circuit board of the present disclosure. In the following, while referring to FIGS. 3A to 3J, please also refer to FIG. 2. First, with reference to FIG. 3A, a step S210 is implemented, including providing a substrate 11, and having a first metal layer 12 on the substrate 11. The substrate 11 is, for example, a polyimide substrate, a glass substrate, a ceramic substrate, or an insulating silicon substrate. In addition, the first metal layer 12 is made of, for example, copper, and the first metal layer 12 is used as a seed layer for electroplating in a subsequent process. Subsequently, with reference to FIG. 3B, a step S220 is implemented, including forming a patterned first opening 12a on the first metal layer 12, wherein the first opening 12a exposes a portion of a surface of the substrate 11. In the present embodiment, the patterned first opening 12a is formed on the first metal layer 12 by photolithography. Here, the so-called photolithography refers to engraving geometrical figures on the photoresist layer by exposure and development, and then transferring the geometric figures on the photomask to the metal layer (here, the first metal layer 12) by etching. For those skilled in the art, since photolithography is already a mature technology, it will not be described in detail here.

Figure 3A:
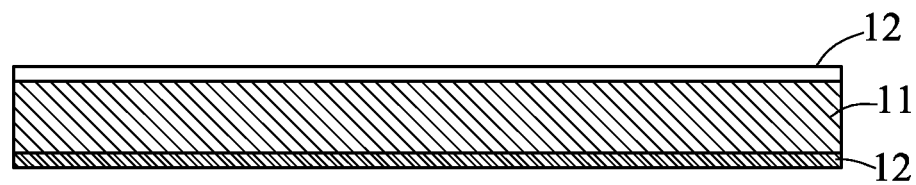
FIGS. 3A to 3J are diagrams illustrating the process for manufacturing a circuit board according to an embodiment of the present disclosure.
Figure 3B:
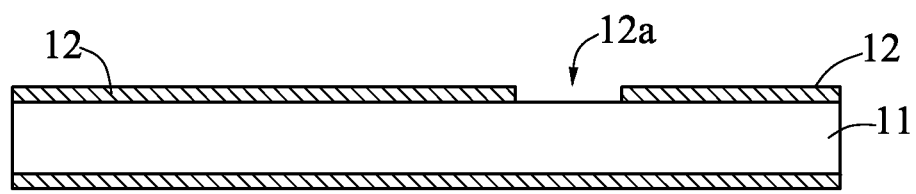
Figure 3C:
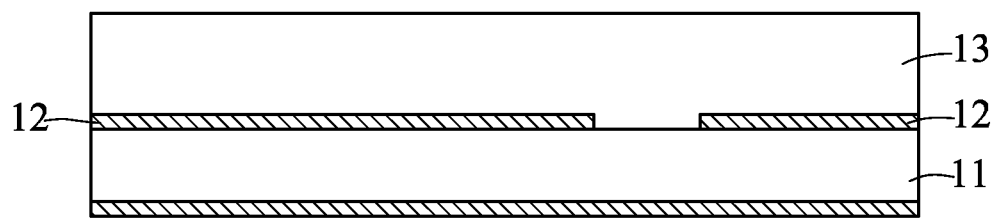
Figure 3D:
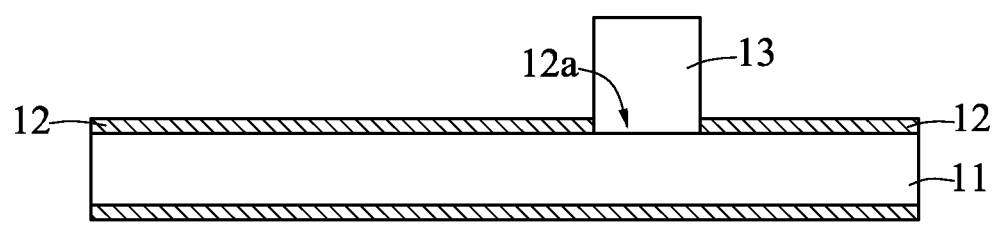
Figure 3E:
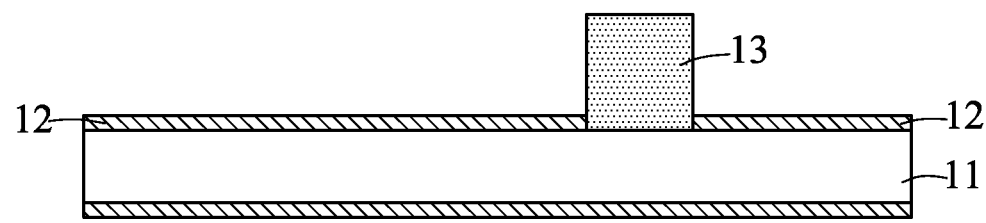

Then, with reference to FIG. 3C, a step S230 is implemented, including covering a first dielectric layer 13 on the substrate 11, the first dielectric layer 13 being mainly made of photo imageable dielectric material, the photo imageable dielectric material being for example a photosensitive polyimide. And then, with reference to FIG. 3D, a step S240 is implemented, including patterning the first dielectric layer 13 by photolithography. It can be seen from FIG. 3D that the patterned first dielectric layer 13 covers the first opening 12a. Next, with reference to FIG. 3E, a step S245 is implemented, including photosensitizing the first dielectric layer 13 to cure the first dielectric layer 13. In the present embodiment, the first dielectric layer 13 is cured by ultraviolet light.

Figure 3F:
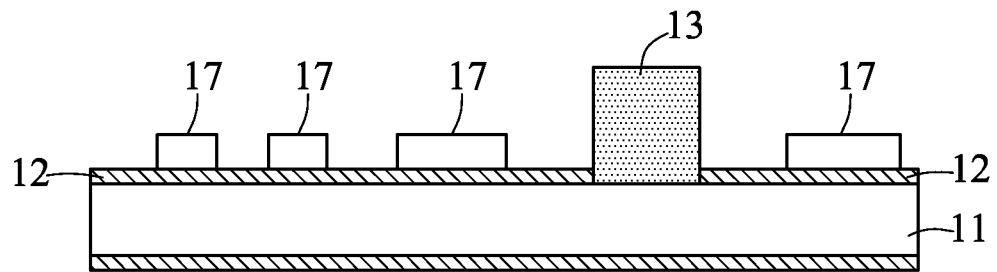
Figure 3G:
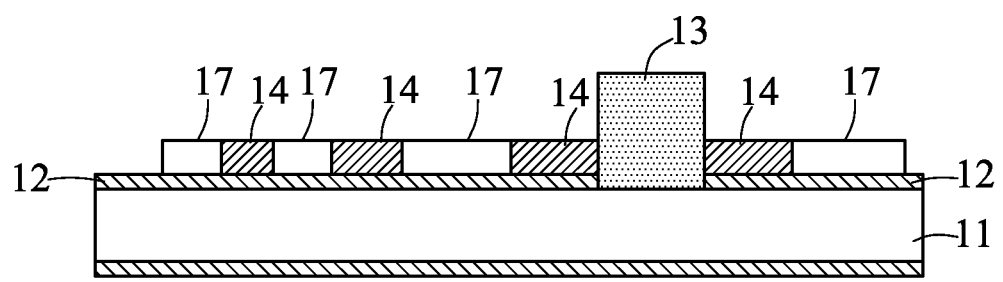

And then, with reference to FIG. 3F, a step S250 is implemented, including forming a patterned photoresist layer 17 on the first metal layer 12 by photolithography. Next, with reference to FIG. 3G, a step S255 is implemented, including forming the patterned second metal layer 14 on a region of the first metal layer 12 that is not covered by the first photoresist layer 17. In the present embodiment, the first metal layer 12 is used as the seed layer and electroplated, so that the region not covered by the first photoresist layer 17 will deposit metal to form the second metal layer 14. In the present embodiment, a thickness of the first metal layer 12 may be 3 to 7 μm, and a thickness of the second metal layer 14 may be 20 to 30 μm.

Figure 3H:
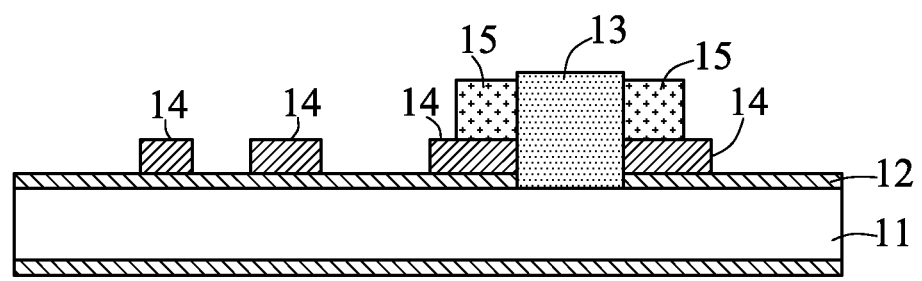
Figure 3I:
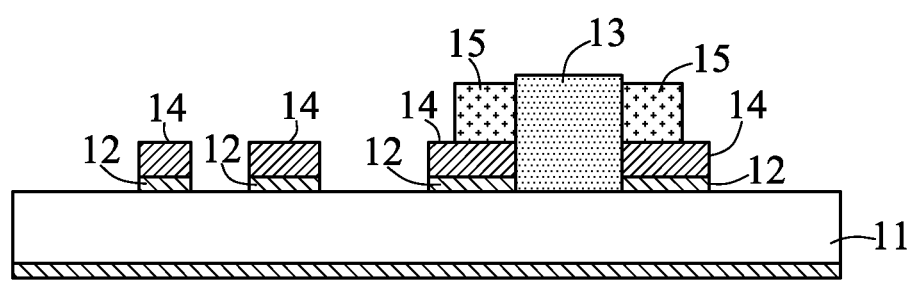

Subsequently, with reference to FIG. 3H, a step S260 is implemented, including forming a patterned third metal layer 15 on a portion of the second metal layer 14. It can be seen from FIG. 3H that the third metal layer 15 is adjacent to the cured first dielectric layer 13. And, in the present embodiment, a thickness of the third metal layer 15 may be 70 to 80 μm, which is larger than the thickness of the second metal layer 14. And, a width of the third metal layer 15 is smaller than a width of the second metal layer 14. Regarding how to form the patterned third metal layer 15, the detailed process will be detailed in other paragraphs later. And then, with reference to FIG. 3I, a step S270 is implemented, including removing the first metal layer 12 not covered by the second metal layer 14. Next, with reference to FIG. 3J, a step S280 is implemented, including forming a second dielectric layer 16 on the substrate 11. It can be seen from FIG. 3J that the second dielectric layer 16 covers the first dielectric layer 13, a second metal layer 14 and a third metal layer 15. In the present embodiment, since the first dielectric layer 13 and the second dielectric layer 16 are made of different materials, the first dielectric layer 13 and the second dielectric layer 16 have different dielectric constants and dissipation factors. In the present embodiment, the material of the second dielectric layer 16 may include inorganic materials (for example, silicon oxide, silicon nitride, silicon oxynitride), organic materials, or other suitable dielectric materials. Further, a fourth metal layer 19 is further coated on an upper surface of the second dielectric layer 16, and other components may be formed on an upper surface of the second dielectric layer 16 through the fourth metal layer 19.

In the present embodiment, the second dielectric layer 16 is formed by laminating. Here, the laminating refers to bonding the second dielectric layer 16 in a semi-fused state to the substrate 11 under pressure, reducing the temperature by cooling after the hot pressing is completed, so as to embedding the first dielectric layer 13, the second metal layer 14, and the third metal layer 15 in the second dielectric layer 16. After the process in FIGS. 3A to 3J, the circuit board 10 shown in FIG. 4A is formed.

Figure 1A:
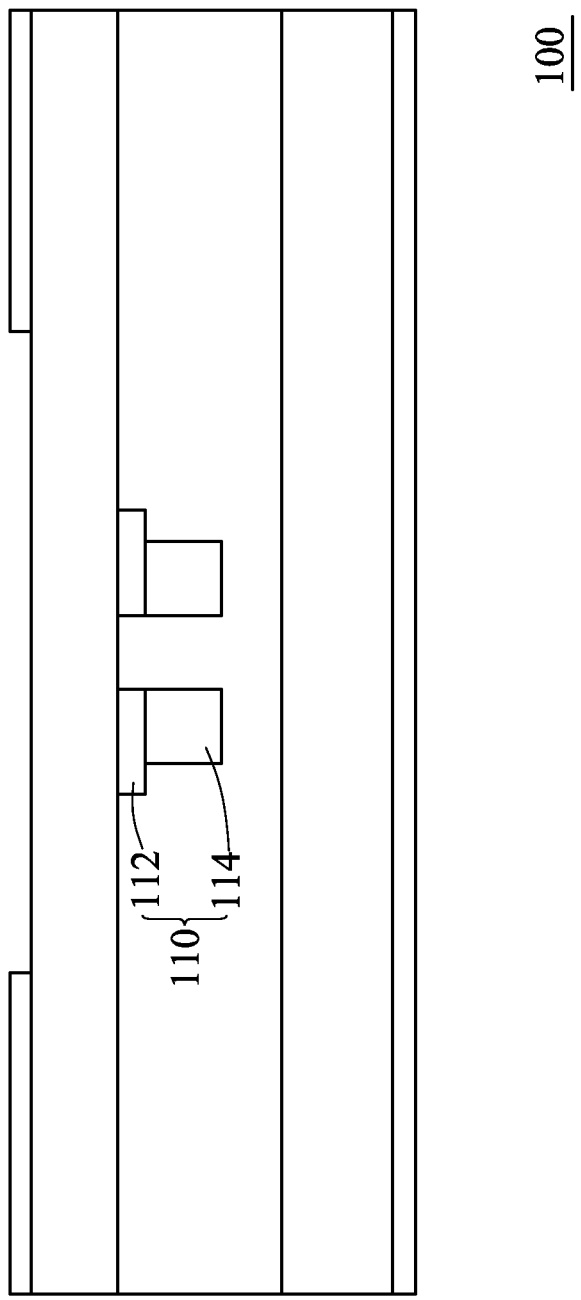
FIG. 1A is a diagram of a conventional circuit board.
Figure 1B:
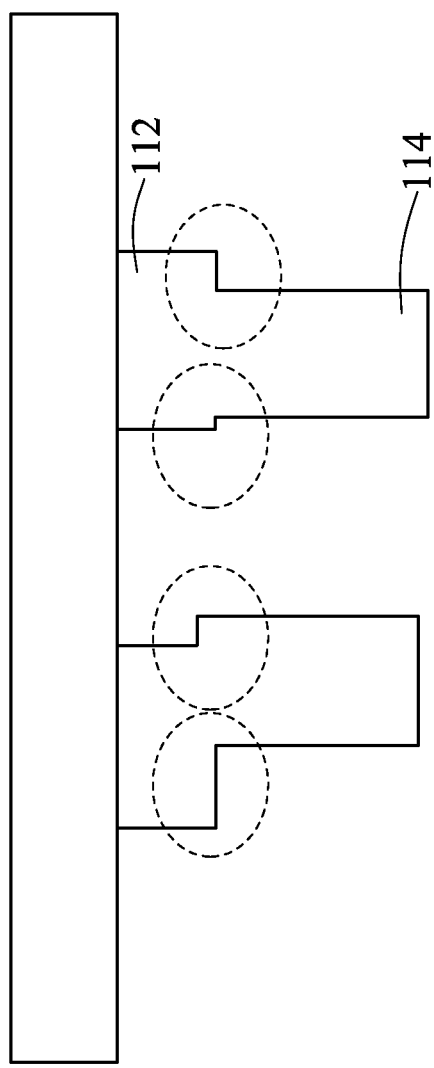
FIG. 1B is a diagram of a conventional signal wire.

Hereinafter, a process shown in FIG. 3H will be described in more detail. With reference to FIG. 5 and FIGS. 6A to 6D, FIG. 5 is a flow chart of manufacturing the third metal layer, and FIGS. 6A to 6D illustrates an embodiment about manufacturing the third metal layer. First, with reference to FIG. 6A, after the patterned second metal layer 14 is formed, a step S262 is implemented, including forming a second photoresist layer 18 on the substrate 11. In the present embodiment, the cured first dielectric layer 13 preferably has a certain strength, otherwise it is easily crushed by the second photoresist layer 18 formed later. Then, with reference to FIG. 6B, a step S264 is implemented, including forming a patterned second opening 18a on the second photoresist layer 18 by photolithography. It can be seen from FIG. 6B that the second opening 18a exposes the first dielectric layer 13 and a portion of the second metal layer 14, and the exposed second metal layer 14 is adjacent to the first dielectric layer 13. Subsequently, with reference to FIG. 6C, a step S266 is implemented, including forming the third metal layer 15 on the second opening 18a. In the present embodiment, the third metal layer 15 is formed on the exposed second metal layer 14 by electroplating. When the third metal layer 15 is formed, there is no traditional misalignment (see FIG. 1B) between the third metal layer 15 and the second metal layer 14 due to the existence of the first dielectric layer 13 and the exposed second metal layer 14 being adjacent to the first dielectric layer 13. And then, with reference to FIG. 6D, a step S268 is implemented, including removing the second photoresist layer 18 and the first photoresist layer 17.

Figure 3J:
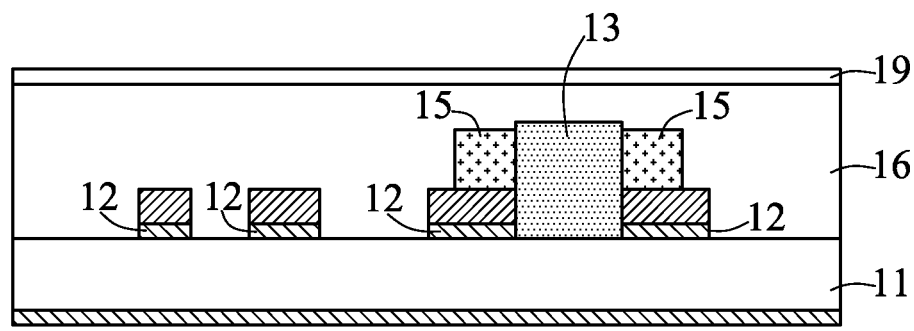
Figure 4A:
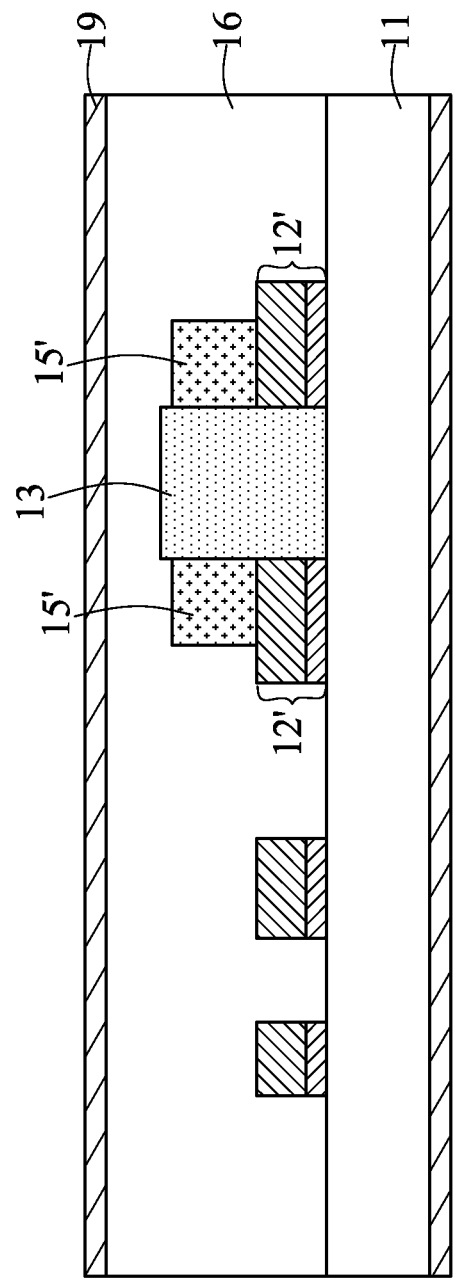
FIG. 4A is a structural diagram of a circuit board according to an embodiment of the present disclosure.

With reference to FIG. 4A, FIG. 4A illustrates an embodiment of a circuit board of the present disclosure. The circuit board 10 includes a substrate 11, a plurality of patterned first circuits 12', at least one pair of second circuits 15', a first dielectric layer 13 and a second dielectric layer 16. In FIG. 4A, the second circuits 15' is disposed on one pair of the above first circuits 12', and the first dielectric layer 13 separates the pair of the second circuits 15' and the pair of first circuits 12' disposed on the pair of second circuits 15'. With reference to FIG. 3J together, the first circuits 12' are composed of the first metal layer 12 and the second metal layer 14 shown in FIG. 3J, and the second circuits 15' are the third metal layer 15 shown in FIG. 3J. Since the thickness of the second circuit 15' is greater than the thickness of the first circuit 12' and the width of the second circuit 15' is smaller than the width of the first circuit 12', the pair of second circuits 15' and the first circuits 12' below may be regarded as the signal wires 110 as disclosed in U.S. Ser. No. 10/079,158 for transmitting differential signals. However, different from the signal wires 110 as disclosed in U.S. Ser. No. 10/079,158, the first dielectric layer 13 is embedded between the second circuits 15', and the first dielectric layer 13 and the second dielectric layer 16 have different dielectric constants and dissipation factors, so there can be more degrees of freedom in the design of the circuit board. In FIG. 4A, although one pair of second circuits 15' is shown, those skilled in the art should understand that a plurality of pair of second circuits 15' may be disposed in the circuit board 10.

Figure 4B:
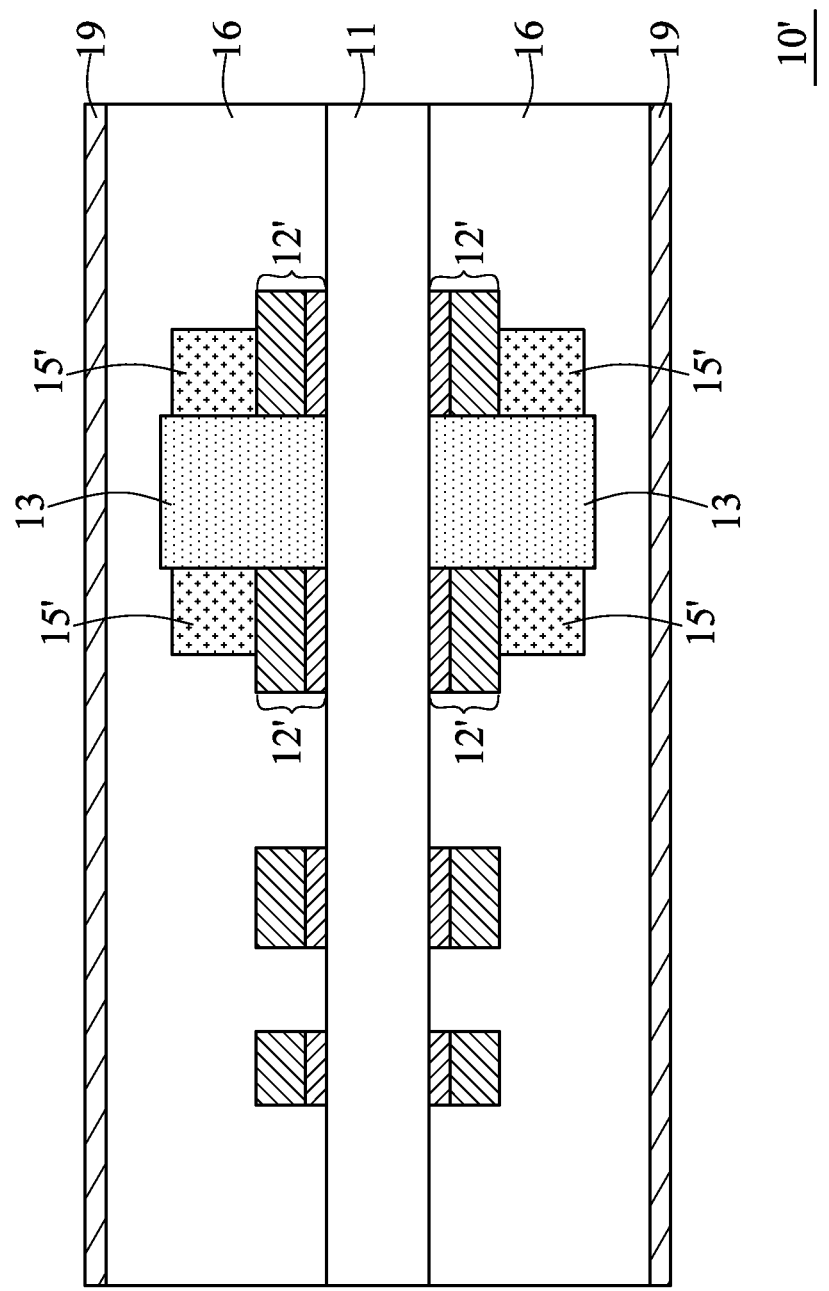
FIG. 4B is a structural diagram of a circuit board according to another embodiment of the present disclosure.
Figure 5:
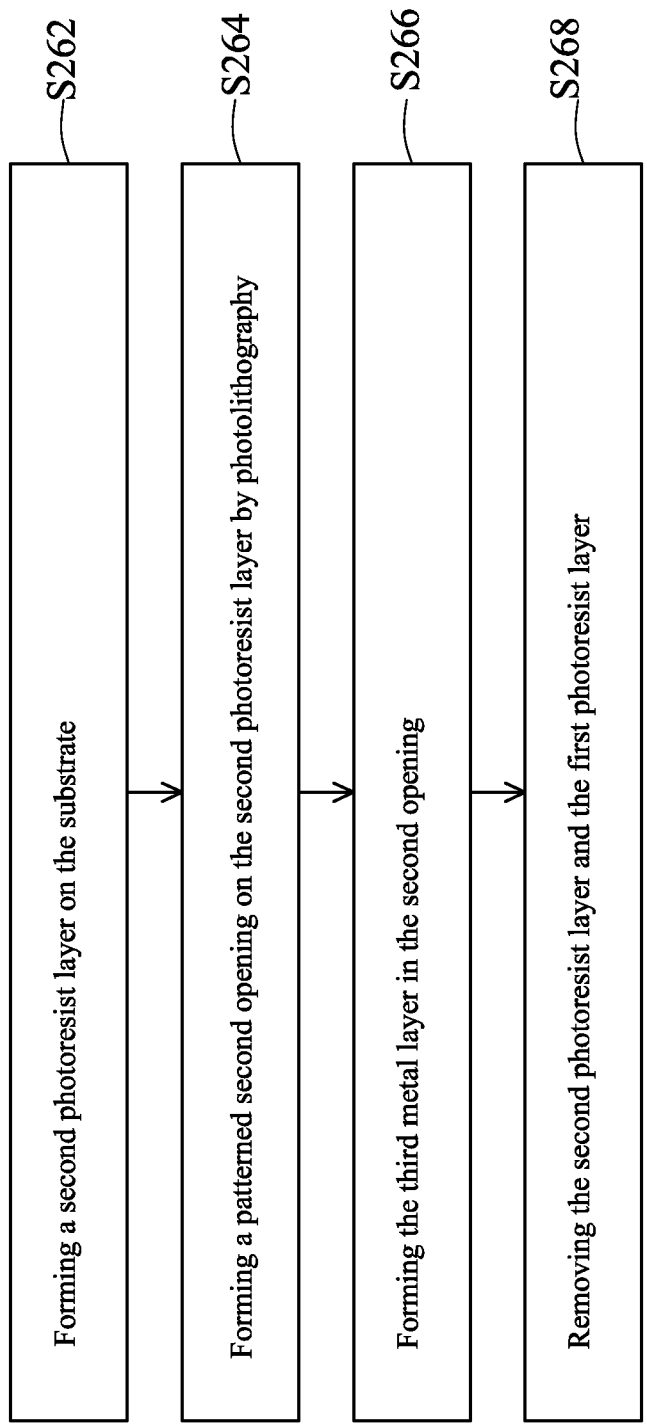
FIG. 5 is a flowchart of manufacturing the third metal layer.
Figure 6A:
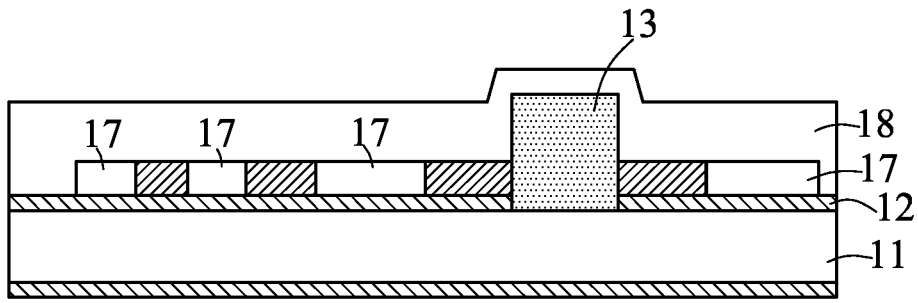
FIGS. 6A to 6D are diagrams illustrating embodiments related to the manufacture of the third metal layer.
Figure 6B:
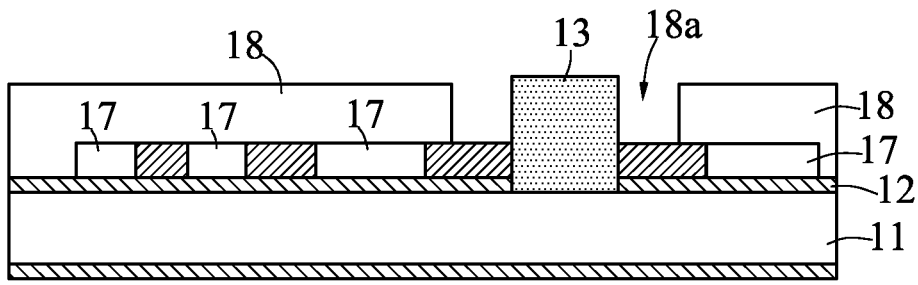
Figure 6C:
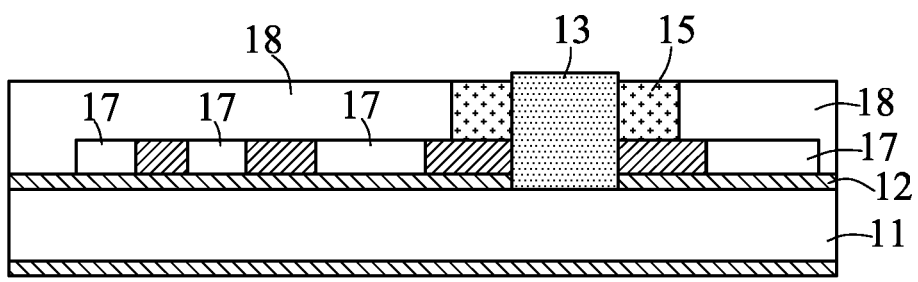
Figure 6D:
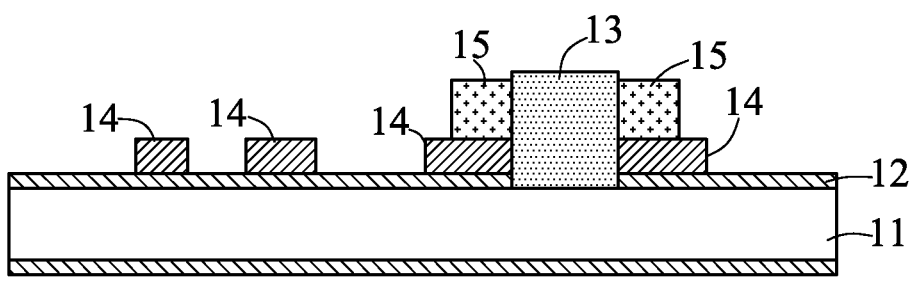

It should be noted that in the above manufacturing processes, all processes are performed at one surface of the substrate 11, but with reference to FIG. 3A, both an upper surface and a lower surface of the substrate 11 are provided with the first metal layer 12, so the same process may also be performed on the other surface of the substrate 11 to form a circuit board 10' as shown in FIG. 4B. Of course, those skilled in the art may also perform different processes on the upper and lower surfaces of the substrate 11 respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method for a circuit board, comprising:
   (a) providing a substrate, having a first metal layer on the substrate;
   (b) forming a patterned first opening on the first metal layer, the first opening exposing the substrate;
   (c) forming a patterned first dielectric layer on the substrate, the first dielectric layer mainly made of a photosensitive dielectric material, and the first dielectric layer covering the first opening;
   (d) photosensitizing the first dielectric layer to cure the first dielectric layer;
   (e) forming a patterned second metal layer on the first metal layer;
   (f) forming a patterned third metal layer on a portion of the second metal layer, and the third metal layer being adjacent to the first dielectric layer;
   (g) removing a portion of the first metal layer that is not covered by the second metal layer; and
   (h) forming a second dielectric layer on the substrate, the second dielectric layer at least covering the first dielectric layer, the second metal layer and the third metal layer;

wherein a thickness of the third metal layer is larger than a thickness of the second metal layer; and wherein a width of the third metal layer is smaller than a width of the second metal layer.

2. The manufacturing method for a circuit board according to claim 1, wherein the step (e) further comprises steps of:
   (e1) forming a patterned first photoresist layer on the first metal layer; and
   (e2) forming the patterned second metal layer on a region of the first metal layer that is not covered by the first photoresist layer.

3. The manufacturing method for a circuit board according to claim 2, wherein in the step (e2), the first metal layer is used as a seed layer, and the second metal layer is formed by electroplating.

4. The manufacturing method for a circuit board according to claim 2, wherein the step (f) further comprises steps of:
   (f1) forming a second photoresist layer on the substrate;
   (f2) forming a patterned second opening on the second photoresist layer, the second opening exposing the first dielectric layer and a portion of the second metal layer;
   (f3) forming the third metal layer in the second opening; and
   (f4) removing the second photoresist layer and the first photoresist layer.

5. The manufacturing method for a circuit board according to claim 4, wherein in the step (f3), the third metal layer is formed by electroplating.

6. The manufacturing method for a circuit board according to claim 1, wherein in the step (h), the second dielectric layer is formed by laminating.

7. The manufacturing method for a circuit board according to claim 1, wherein the first metal layer, the second metal layer, and the third metal layer are mainly composed of copper.

8. The manufacturing method for a circuit board according to claim 1, wherein the first dielectric layer and the second dielectric layer have different dielectric constants and dissipation factors.

9. A circuit board, comprising:
- a substrate;
- a plurality of patterned first circuits, disposed on the substrate;
- at least one pair of second circuits, disposed on the at least one pair of first circuits;
- a first dielectric layer, disposed on the substrate, and the first dielectric layer separating the pair of the second circuits and the pair of first circuits disposed on the pair of second circuits; and
- a second dielectric layer, disposed on the substrate, and the second dielectric layer at least covering the first dielectric layer, the first circuits and the pair of second circuits;
- wherein thicknesses of the second circuits are larger than thicknesses of the first circuits; and wherein widths of the second circuits are smaller than widths of the first circuits.

10. The circuit board according to claim 9, wherein the first dielectric layer and the second dielectric layer have different dielectric constants and dissipation factors.

* * * * *